(12) United States Patent
Chen et al.

(10) Patent No.: US 12,316,102 B2
(45) Date of Patent: May 27, 2025

(54) METHOD FOR DETECTING ABNORMAL DIRECT CURRENT VOLTAGE MEASUREMENT IN HIGH VOLTAGE FLEXIBLE DIRECT CURRENT TRANSMISSION SYSTEM

(71) Applicant: ELECTRIC POWER RESEARCH INSTITUTE. CHINA SOUTHERN POWER GRID, Guangdong (CN)

(72) Inventors: Qinlei Chen, Guangdong (CN); Shuyong Li, Guangdong (CN); Qi Guo, Guangdong (CN); Libin Huang, Guangdong (CN); Xuehua Lin, Guangdong (CN); Zhijiang Liu, Guangdong (CN); Deyang Chen, Guangdong (CN); Chao Luo, Guangdong (CN); Guanming Zeng, Guangdong (CN); Mengjun Liao, Guangdong (CN); Lijun Deng, Guangdong (CN); Liu Cui, Guangdong (CN); Zhida Huang, Guangdong (CN); Haiping Guo, Guangdong (CN); Tianyu Guo, Guangdong (CN)

(73) Assignee: ELECTRIC POWER RESEARCH INSTITUTE. CHINA SOUTHERN POWER GRID, Guangdong (CN)

( * ) Notice: Subject to any disclaimer, the term of this patent is extended or adjusted under 35 U.S.C. 154(b) by 0 days.

(21) Appl. No.: 18/014,022

(22) PCT Filed: May 18, 2022

(86) PCT No.: PCT/CN2022/093519
§ 371 (c)(1),
(2) Date: Dec. 30, 2022

(87) PCT Pub. No.: WO2023/109006
PCT Pub. Date: Jun. 22, 2023

(65) Prior Publication Data
US 2024/0097434 A1 Mar. 21, 2024

(30) Foreign Application Priority Data
Dec. 13, 2021 (CN) .......................... 202111517934.9

(51) Int. Cl.
G01R 31/08 (2020.01)
H02H 7/26 (2006.01)
H02J 3/36 (2006.01)

(52) U.S. Cl.
CPC ........... *H02H 7/268* (2013.01); *G01R 31/086* (2013.01); *H02J 3/36* (2013.01)

(58) Field of Classification Search
CPC ...... H02H 7/268; G01R 31/086; G01R 31/08; H02J 3/36
See application file for complete search history.

(56) References Cited

U.S. PATENT DOCUMENTS

| 12,074,535 B2 * | 8/2024 | Uda ........................ H02J 3/388 |
| 2020/0212679 A1 | 7/2020 | Majumder et al. |

(Continued)

FOREIGN PATENT DOCUMENTS

| CN | 105223406 A | 1/2016 |
| CN | 110456131 A | 11/2019 |

(Continued)

OTHER PUBLICATIONS

International Search Report for PCT/CN2022/093519 mailed Aug 23, 2022, ISA/CN.

(Continued)

*Primary Examiner* — Adolf D Berhane
(74) *Attorney, Agent, or Firm* — Yue (Robert) Xu; Apex Attorneys at Law

(57) ABSTRACT

A method for detecting abnormal direct current voltage measurement in a modular multilevel converter high voltage (Continued)

direct current transmission system is provided. In the method, a valve group voltage at a detection pole is obtained, voltages at voltage measurement points at the detection pole are collected, and comparison and determination are performed based on the actual arrangement of the voltage measurement points, and then whether an abnormal measurement occurs at each of the voltage measurement points is determined.

10 Claims, 4 Drawing Sheets

(56) References Cited

U.S. PATENT DOCUMENTS

| | | | |
|---|---|---|---|
| 2020/0389084 A1* | 12/2020 | Ergin | H01H 33/596 |
| 2021/0384816 A1* | 12/2021 | Xiao | H02M 7/4835 |
| 2024/0168074 A1* | 5/2024 | Verma | H02H 1/0007 |

FOREIGN PATENT DOCUMENTS

| | | |
|---|---|---|
| CN | 110837023 A | 2/2020 |
| CN | 112968462 A | 6/2021 |
| CN | 114172133 A | 3/2022 |
| CN | 114204683 A | 3/2022 |

OTHER PUBLICATIONS

Hao Li et al., Study on Abnormal Voltage Measurement Value of DC Voltage Divider,Electronics World, Oct. 15, 2019, pp. 22-23,26,DOI:10.19353/j.cnki.dzsj.2019.19.006.
The 1st Office Action dated Jul. 13, 2024 for the Chinese Patent Application No. CN202111517934.9.

* cited by examiner

METHOD FOR DETECTING ABNORMAL DIRECT CURRENT VOLTAGE MEASUREMENT IN HIGH VOLTAGE FLEXIBLE DIRECT CURRENT TRANSMISSION SYSTEM

The present application is the national phase of International Patent Application No. PCT/CN2022/093519, titled "METHOD FOR DETECTING ABNORMAL DIRECT CURRENT VOLTAGE MEASUREMENT IN HIGH VOLTAGE FLEXIBLE DIRECT CURRENT TRANSMISSION SYSTEM", filed on May 18, 2022, which claims priority to Chinese Patent Application No. 202111517934.9, titled "METHOD FOR DETECTING ABNORMAL DIRECT CURRENT VOLTAGE MEASUREMENT IN HIGH VOLTAGE FLEXIBLE DIRECT CURRENT TRANSMISSION SYSTEM", filed on Dec. 13, 2021 with the Chinese Patent Office, both of which are incorporated herein by reference in their entireties.

FIELD

The present disclosure relates to the technical field of power systems, and in particular to a method for detecting abnormal direct current voltage measurement in a modular multilevel converter high voltage direct current transmission system.

BACKGROUND

After more than 40 years of development, the line commutate converter high voltage direct current transmission (LCC-HVDC) system based on the thyristor technology is very mature. At present, LCC-HVDC is widely used in scenarios such as a long-distance high capacity transmission scenario and an asynchronous grid interconnection scenario. However, the LCC-HVDC has high requirements for the connected alternating current grid, and cannot used in passive power grid. A large amount of reactive power is consumed in the operation of the LCC-HVDC, restricting further development of the LCC-HVDC.

Modular multilevel converter (MMC) has the advantages of modular design, high scalability, flexible operation in four quadrants of power, less alternating current voltage harmonics, small footprint and the like, and are widely researched and utilized in the asynchronous interconnection of alternating current grids, wind farm access and other fields in recent years. The MMC topology structure is adopted in the completed Nan'ao multi-terminal MMC-HVDC (modular multilevel converter high voltage direct current) project, Yunnan asynchronous grid interconnection project, Shanghai Nanhui MMC-HVDC project, Zhoushan five-terminal MMC-HVDC project, Xiamen MMC-HVDC project, Zhangbei MMC power grid project and the like in China.

Measurement system is a link between the HVDC high voltage device and the HVDC control and protection system. To ensure the reliability and integrity of data of the HVDC control and protection system, each of control/protection systems, corresponding to the redundant configuration of the control and protection system, is arranged with an independent measurement loop. However, due to the influence of device reliability, many measurement deviations and quality abnormalities of the measurement systems occur in the HVDC projects that have been put into operation in China. The measurement deviations and the quality abnormalities of the measurement system directly affect the protection system, control system and the normal operation of HVDC.

The direct current voltage control of the HVDC system is performed based on direct current voltage measurement points, which is critical to the stable operation of the HVDC system. For the LCC-HVDC, when a direct current voltage single measurement deviation occurs, it is only required to switch the control system. In addition, in order to prevent abnormal and frequent mis-switching of the control system, a switching delay is often set to a second level. Compared with the LCC-HVDC, the MCC-HVDC has much greater control speed and dynamic response speed, and an MMC converter valve is more susceptible to abnormal direct current voltage measurement. In a case that a direct current voltage single measurement deviation occurs, if the MMC-HVDC still adopts the strategy of switching the control system, the abnormal direct current voltage may cause over-voltage of the MMC converter valve under the control of the control system before the switching of the control system is completed (as it takes a few seconds from the occurrence of the abnormal measurement to the completion of the control system switching), resulting in block of MMC-HVDC.

At present, the locating method and the fast diagnosing method for a LCC-HVDC measurement abnormal fault have been studied in academia and industry. However, there are relatively few researches on a method for detecting abnormal direct current voltage measurement in MMC-HVDC, and there is no special research on a method for dealing with the abnormal direct current voltage measurement in MMC-HVDC.

SUMMARY

A method for detecting abnormal direct current voltage measurement in a modular multilevel converter high voltage direct current transmission system is provided according to the present disclosure, to solve the technical problem that the locating method and the fast diagnosing method focusing on LCC-HVDC direct current voltage measurement abnormal fault cannot be applied to detecting a single abnormal measurement in MMC-HVDC.

In view of this, a method for detecting abnormal direct current voltage measurement in a modular multilevel converter high voltage direct current transmission system is provided in a first aspect of the present disclosure. The method includes:

obtaining a valve group voltage corresponding to an average value of sums of capacitor voltages of submodules of a three-phase bridge arm of a modular multilevel converter valve from a valve base controller of an operating valve group at a detection pole in a modular multilevel converter high voltage direct current transmission system with a symmetrical bipolar structure;

collecting a first voltage at a pole bus direct current voltage measurement point and a second voltage at a neutral bus voltage measurement point of a duty control system at the detection pole based on direct current voltage measurement points set in the modular multilevel converter high voltage direct current transmission system with the symmetrical bipolar structure;

in a case that the modular multilevel converter high voltage direct current transmission system with the symmetrical bipolar structure is set with a direct current line side direct current voltage measurement point, collecting a third voltage at the direct current line side direct current voltage measurement point; and in a case that the modular multilevel converter high voltage direct current transmission system with the symmetrical bipolar structure is not set with a direct current line side direct current voltage measurement point, collecting a fourth voltage at a pole bus direct current voltage measurement point of a standby control system at the detection pole;

calculating a difference between the first voltage and a sum of the second voltage and the valve group voltage, filtering the difference with a first order low pass filter and calculating an absolute value of the filtered difference to obtain a fifth voltage;

in the case that the modular multilevel converter high voltage direct current transmission system with the symmetrical bipolar structure is set with the direct current line side direct current voltage measurement point, filtering a difference between the first voltage and the third voltage with the first order low pass filter and calculating an absolute value of the filtered difference to obtain a sixth voltage; and in the case that the modular multilevel converter high voltage direct current transmission system with the symmetrical bipolar structure is not set with the direct current line side direct current voltage measurement point, filtering a difference between the first voltage and the fourth voltage with the first order low pass filter and calculating an absolute value of the filtered difference to obtain a seventh voltage;

comparing the fifth voltage with the sixth voltage or comparing the fifth voltage with the seventh voltage, and performing a hysteresis comparison on a smaller one of the fifth voltage and the sixth voltage or a smaller one of the fifth voltage and the seventh voltage and a predetermined pole bus direct current voltage measurement abnormal detection threshold; and in a case of meeting a first hysteresis condition of the hysteresis comparison, generating an abnormal pole bus direct current voltage measurement flag bit for the duty control system at the detection pole after a first predetermined delay.

In an embodiment, after generating the abnormal pole bus direct current voltage measurement flag bit for the duty control system at the detection pole, the method further includes:

in a case of not meeting the first hysteresis condition of the hysteresis comparison, clearing the abnormal pole bus direct current voltage measurement flag bit for the duty control system at the detection pole after a second predetermined delay.

In an embodiment, after collecting the first voltage at the pole bus direct current voltage measurement point and the second voltage at the neutral bus voltage measurement point of the duty control system at the detection pole, the method further includes:

calculating a difference between the second voltage and a difference between the first voltage and the valve group voltage, filtering the difference with the first order low pass filter and calculating an absolute value of the filtered difference to obtain an eighth voltage;

collecting a ninth voltage at a neutral bus voltage measurement point of the standby control system at the detection pole;

filtering a difference between the second voltage and the ninth voltage with the first order low pass filter and calculating an absolute value of the filtered difference to obtain a tenth voltage;

comparing the eighth voltage with the tenth voltage, and performing a hysteresis comparison on a smaller one of the eighth voltage and the tenth voltage and a predetermined neutral bus voltage measurement abnormal detection threshold; and in a case of meeting a second hysteresis condition of the hysteresis comparison, generating an abnormal neutral bus voltage measurement flag bit for the duty control system at the detection pole after a third predetermined delay.

In an embodiment, after generating the abnormal neutral bus voltage measurement flag bit for the duty control system at the detection pole, the method further includes:

in a case of not meeting the second hysteresis condition of the hysteresis comparison, clearing the abnormal neutral bus voltage measurement flag bit for the duty control system at the detection pole after a fourth predetermined delay.

In an embodiment, after generating the abnormal pole bus direct current voltage measurement flag bit for the duty control system at the detection pole, the method further includes:

in the case that the modular multilevel converter high voltage direct current transmission system with the symmetrical bipolar structure is set with the direct current line side direct current voltage measurement point, performing a modular multilevel converter high voltage direct current voltage control based on the direct current line side direct current voltage measurement point of the duty control system at the detection pole instead of the pole bus direct current voltage measurement point of the duty control system at the detection pole; and in the case that the modular multilevel converter high voltage direct current transmission system with the symmetrical bipolar structure is not set with the direct current line side direct current voltage measurement point, performing a modular multilevel converter high voltage direct current voltage control based on the pole bus direct current voltage measurement point of the standby control system at the detection pole instead of the pole bus direct current voltage measurement point of the duty control system at the detection pole.

In an embodiment, after generating the abnormal neutral bus voltage measurement flag bit for the duty control system at the detection pole, the method further includes:

performing a modular multilevel converter high voltage direct current voltage control based on the neutral bus voltage measurement point of the standby control system at the detection pole instead of the neutral bus voltage measurement point of the duty control system at the detection pole.

An apparatus for detecting abnormal direct current voltage measurement in a modular multilevel converter high voltage direct current transmission system is provided in a second aspect of the present disclosure. The apparatus includes a first measurement unit, a second measurement unit, a third measurement unit, a first calculation unit, a second calculation unit, a first comparison unit and a first marking unit.

The first measurement unit is configured to obtain a valve group voltage corresponding to an average value of sums of capacitor voltages of sub-modules of a three-phase bridge arm of a modular multilevel converter high voltage direct current converter valve from a valve base controller of an operating valve group at a detection pole in a modular multilevel converter high voltage direct current transmission system with a symmetrical bipolar structure.

The second measurement unit is configured to collect a first voltage at a pole bus direct current voltage measurement point and a second voltage at a neutral bus voltage measurement point of a duty control system at the detection pole based on direct current voltage measurement points set in the modular multilevel converter high voltage direct current transmission system with the symmetrical bipolar structure.

The third measurement unit is configured to collect a third voltage at a direct current line side direct current voltage measurement point in a case that the modular multilevel converter high voltage direct current transmission system with the symmetrical bipolar structure is set with the direct current line side direct current voltage measurement point, and collect a fourth voltage at a pole bus direct current voltage measurement point of a standby control system at the detection pole in a case that the modular multilevel converter high voltage direct current transmission system with the symmetrical bipolar structure is not set with a direct current line side direct current voltage measurement point.

The first calculation unit is configured to calculate a difference between the first voltage and a sum of the second voltage and the valve group voltage, and filter the difference with a first order low pass filter and calculate an absolute value of the filtered difference to obtain a fifth voltage.

The second calculation unit is configured to filter a difference between the first voltage and the third voltage with the first order low pass filter and calculate an absolute value of the filtered difference to obtain a sixth voltage in a case that the modular multilevel converter high voltage direct current transmission system with the symmetrical bipolar structure is set with the direct current line side direct current voltage measurement point, and filter a difference between the first voltage and the fourth voltage with the first order low pass filter and calculate an absolute value of the filtered difference to obtain a seventh voltage in a case that the modular multilevel converter high voltage direct current transmission system with the symmetrical bipolar structure is not set with the direct current line side direct current voltage measurement point.

The first comparison unit is configured to compare the fifth voltage with the sixth voltage or compare the fifth voltage with the seventh voltage, and perform a hysteresis comparison on a smaller one of the fifth voltage and the sixth voltage or a smaller one of the fifth voltage and the seventh voltage and a predetermined pole bus direct current voltage measurement abnormal detection threshold.

The first marking unit is configured to, in a case of meeting a first hysteresis condition of the hysteresis comparison, generate an abnormal pole bus direct current voltage measurement flag bit for the duty control system at the detection pole after a first predetermined delay.

In an embodiment, the apparatus further includes a third calculation unit, a fourth measurement unit, a fourth calculation unit, a second comparison unit and a second marking unit.

The third calculation unit is configured to calculate a difference between the second voltage and a difference between the first voltage and the valve group voltage, filter the difference with the first order low pass filter and calculate an absolute value of the filtered difference to obtain an eighth voltage.

The fourth measurement unit is configured to collect a ninth voltage at a neutral bus voltage measurement point of the standby control system at the detection pole.

The fourth calculation unit is configured to filter a difference between the second voltage and the ninth voltage with the first order low pass filter and calculate an absolute value of the filtered difference to obtain a tenth voltage.

The second comparison unit is configured to compare the eighth voltage with the tenth voltage and perform a hysteresis comparison on a smaller one of the eighth voltage and the tenth voltage and a predetermined neutral bus voltage measurement abnormal detection threshold.

The second marking unit is configured to, in a case of meeting a second hysteresis condition of the hysteresis comparison, generate an abnormal neutral bus voltage measurement flag bit for the duty control system at the detection pole after a third predetermined delay.

In an embodiment, the apparatus further includes a first processing unit.

The first processing unit is configured to: perform a modular multilevel converter high voltage direct current voltage control based on the direct current line side direct current voltage measurement point of the duty control system at the detection pole instead of the pole bus direct current voltage measurement point of the duty control system at the detection pole in a case that the modular multilevel converter high voltage direct current transmission system with the symmetrical bipolar structure is set with the direct current line side direct current voltage measurement point, and perform a modular multilevel converter high voltage direct current voltage control based on the pole bus direct current voltage measurement point of the standby control system at the detection pole instead of the pole bus direct current voltage measurement point of the duty control system at the detection pole in a case that the modular multilevel converter high voltage direct current transmission system with the symmetrical bipolar structure is not set with the direct current line side direct current voltage measurement point.

In an embodiment, the apparatus further includes a second processing unit.

The second processing unit is configured to perform a modular multilevel converter high voltage direct current voltage control based on the neutral bus voltage measurement point of the standby control system at the detection pole instead of the neutral bus voltage measurement point of the duty control system at the detection pole.

As can be seen from the above technical solutions, the embodiments of the present disclosure have the following advantages.

A method for detecting abnormal direct current voltage measurement in a modular multilevel converter high voltage direct current transmission system is provided according to the present disclosure. According to the method, a valve group voltage at a detection pole is obtained, voltages at voltage measurement points at the detection pole are collected, and comparison and determination are performed based on the actual arrangement of the voltage measurement points, and then whether an abnormal measurement occurs at each of the voltage measurement points is determined. Based on the actual structure of the modular multilevel converter high voltage direct current transmission system, the problem of abnormal measurement of the voltage measurement points is solved by performing measurement point replacement, thereby solving the technical problem that the locating method and the fast diagnosing method focusing on a conventional direct current voltage measurement abnormal fault according to the conventional technology cannot be applied to detecting a single abnormal measurement in the modular multilevel converter high voltage direct current transmission system.

DETAILED DESCRIPTION OF THE EMBODIMENTS

In order to enable those skilled in the art to better understand the technical solution according to the present disclosure, the technical solutions according to the embodiments of the present disclosure will be described clearly and completely hereinafter with reference to the accompanying drawings in the embodiments of the present disclosure. Apparently, the described embodiments are only part of the embodiments according to the present disclosure, rather than all of the embodiments. All the other embodiments obtained by those skilled in the art based on the embodiments of the present disclosure without creative efforts fall within the protection scope of the present disclosure.

Figure 1:
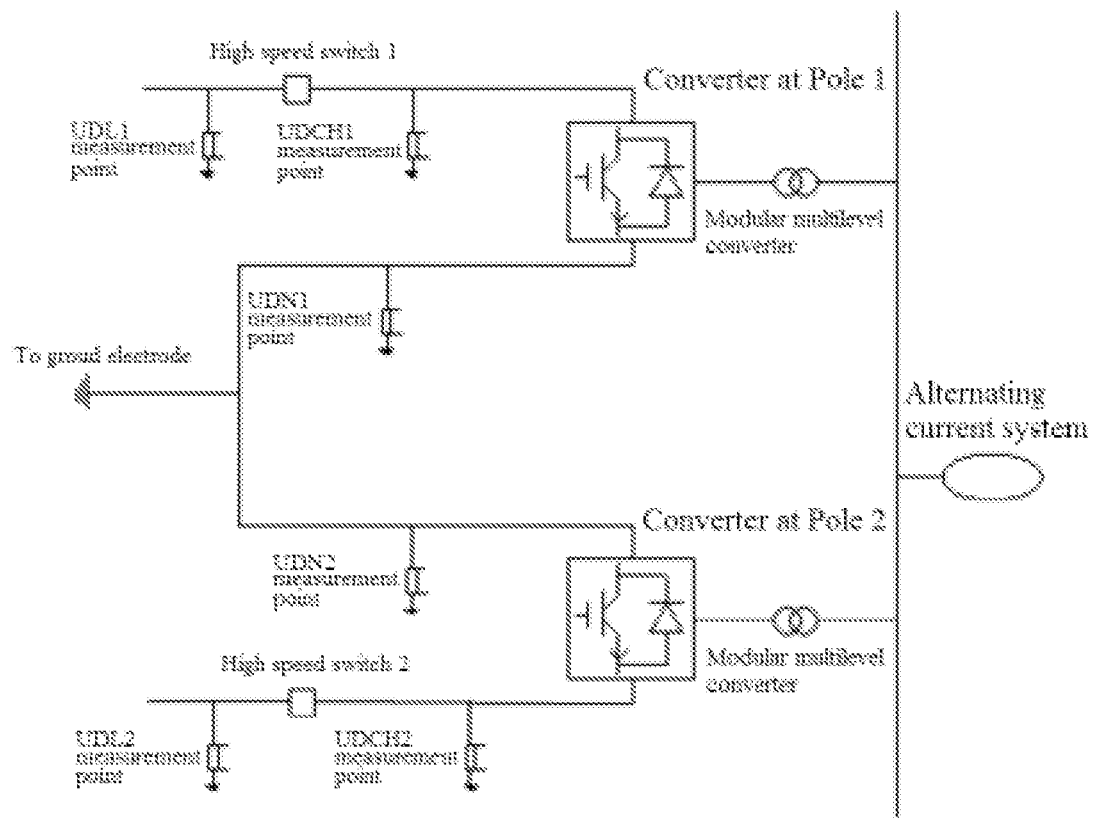
FIG. 1 is a schematic diagram of a typical topology of a single station in a modular multilevel converter high voltage direct current transmission system according to an embodiment of the present disclosure.

It should be understood that the present disclosure is applied to a modular multilevel converter high voltage direct current transmission system. Reference is made to FIG. 1, which is a schematic diagram of a typical topology of a single station in a modular multilevel converter high voltage direct current transmission system according to an embodiment of the present disclosure.

As shown in FIG. 1, the modular multilevel converter high voltage direct current transmission system has a symmetrical bipolar structure. Each of the poles includes only one converter. Each of the poles is set with a pole bus direct current voltage measurement point UDCH (UDCH1 for a pole 1 and UDCH2 for a pole 2) and a neutral bus voltage measurement point UDN (UDN1 for the pole 1 and UDN2 for the pole 2). In addition, each of the poles may be further set with a direct current line side direct current voltage measurement point UDL (UDL1 for the pole 1 and UDL2 for the pole 2) according to actual requirements.

A method for detecting abnormal direct current voltage measurement in a modular multilevel converter high voltage direct current transmission system is provided according to the present disclosure. With the method, the technical problem that the locating method and the fast diagnosing method focusing on a conventional direct current voltage measurement abnormal fault according to the conventional technology cannot be applied to detecting a single abnormal measurement in the modular multilevel converter high voltage direct current transmission system is solved.

Figure 2:
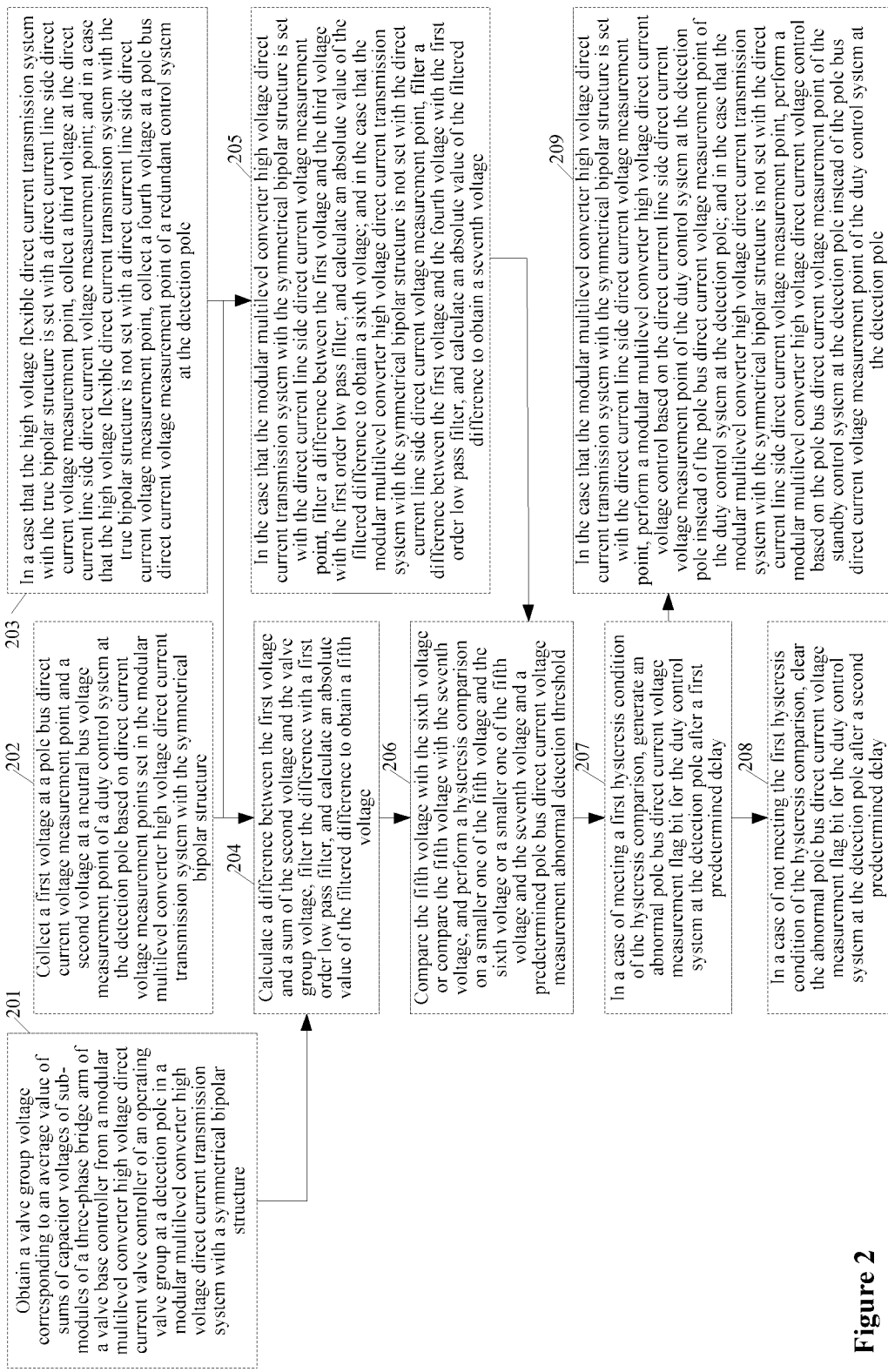
FIG. 2 is a flowchart of a method for detecting abnormal direct current voltage measurement in a modular multilevel converter high voltage direct current transmission system according to a first embodiment of the present disclosure.

For ease of understanding, reference is made to FIG. 2, which is a flowchart of a method for detecting abnormal direct current voltage measurement in a modular multilevel converter high voltage direct current transmission system according to a first embodiment of the present disclosure. As shown in FIG. 2, the method includes the following steps 201 to 209.

In step 201, a valve group voltage corresponding to an average value of sums of capacitor voltages of sub-modules of a three-phase bridge arm of a modular multilevel converter high voltage direct current converter valve from a valve base controller of an operating valve group at a detection pole in a modular multilevel converter high voltage direct current transmission system with a symmetrical bipolar structure is obtained.

It should be noted that in the modular multilevel converter high voltage direct current transmission system with the symmetrical bipolar structure, in a case that a voltage at a detection pole (pole 1) is positive, the valve group voltage UC_C is an average value of sums of capacitor voltages of sub-modules of a three-phase bridge arm of a modular multilevel converter high voltage direct current converter valve transmitted by a valve base controller of a current valve group; and in a case that a voltage at a detection pole (pole 2) is negative, the valve group voltage UC_C is a negative value of an average value of sums of capacitor voltages of sub-modules of a three-phase bridge arm of a modular multilevel converter high voltage direct current converter valve transmitted by a valve base controller of a current valve group.

Firstly, the capacitor voltages of the sub-modules of the three-phase bridge arm of the modular multilevel converter high voltage direct current converter valve transmitted by the valve base controller of the valve group in operating at the detection pole are collected, then the sum of the capacitor voltages of the sub-modules of the three-phase bridge arm is calculated, and finally the average value of the sums corresponding to the three phases is calculated to obtain the valve group voltage UC_C.

In step 202, a first voltage at a pole bus direct current voltage measurement point and a second voltage at a neutral bus voltage measurement point of a duty control system at the detection pole are collected based on direct current voltage measurement points set in the modular multilevel converter high voltage direct current transmission system with the symmetrical bipolar structure.

It should be noted that based on the direct current voltage measurement points set in the modular multilevel converter high voltage direct current transmission system with the symmetrical bipolar structure, a first voltage UDCH at the pole bus direct current voltage measurement point and a second voltage UDN at the neutral bus voltage measurement point of the duty control system at the detection pole are collected.

In step 203, in a case that the modular multilevel converter high voltage direct current transmission system with the symmetrical bipolar structure is set with a direct current line side direct current voltage measurement point, a third voltage at a direct current line side direct current voltage measurement point is collected; and in a case that the modular multilevel converter high voltage direct current transmission system with the symmetrical bipolar structure is not set with a direct current line side direct current voltage measurement point, a fourth voltage at a pole bus direct current voltage measurement point of a standby control system at the detection pole is collected.

It should be noted that a third voltage UDL at the direct current line side direct current voltage measurement point is collected in a case that the modular multilevel converter high voltage direct current transmission system with the symmetrical bipolar structure is set with the direct current line side direct current voltage measurement point, and a fourth voltage UDCH at the pole bus direct current voltage measurement point of the standby control system at the detection pole is collected in a case that the modular multilevel converter high voltage direct current transmission system with the symmetrical bipolar structure is not set with the direct current line side direct current voltage measurement point.

In step 204, a difference between the first voltage and a sum of the second voltage and the valve group voltage is calculated, the difference is filtered by using a first order low pass filter, and an absolute value of the filtered difference is calculated to obtain a fifth voltage.

In step 205, in the case that the modular multilevel converter high voltage direct current transmission system with the symmetrical bipolar structure is set with the direct current line side direct current voltage measurement point, a difference between the first voltage and the third voltage is filtered by using the first order low pass filter, and an absolute value of the filtered difference is calculated to obtain a sixth voltage; and in the case that the modular multilevel converter high voltage direct current transmission system with the symmetrical bipolar structure is not set with the direct current line side direct current voltage measurement point, a difference between the first voltage and the fourth voltage is filtered by using the first order low pass filter, and an absolute value of the filtered difference is calculated to obtain a seventh voltage.

In step 206, the fifth voltage is compared with the sixth voltage or the fifth voltage is compared with the seventh voltage, and a hysteresis comparison is performed on a smaller one of the fifth voltage and the sixth voltage or a smaller one of the fifth voltage and the seventh voltage and a predetermined pole bus direct current voltage measurement abnormal detection threshold.

It should be noted that in the case that the modular multilevel converter high voltage direct current transmission system with the symmetrical bipolar structure is set with the direct current line side direct current voltage measurement point, the fifth voltage is compared with the sixth voltage, and the hysteresis comparison is performed on the smaller one of the fifth voltage and the sixth voltage and the predetermined pole bus direct current voltage measurement abnormal detection threshold. In a case that the smaller one of the fifth voltage and the sixth voltage is greater than the predetermined pole bus direct current voltage measurement abnormal detection threshold, it indicates that a UDCH abnormal measurement occurs at the pole bus direct current voltage measurement point of the duty control system at the detection pole; and in a case that the smaller one of the fifth voltage and the sixth voltage is not greater than the predetermined pole bus direct current voltage measurement abnormal detection threshold, it indicates that no abnormal measurement occurs.

In the case that the modular multilevel converter high voltage direct current transmission system with the symmetrical bipolar structure is not set with the direct current line side direct current voltage measurement point, the fifth voltage is compared with the seventh voltage, and the hysteresis comparison is performed on the smaller one of the fifth voltage and the seventh voltage and the predetermined pole bus direct current voltage measurement abnormal detection threshold. In a case that the smaller one of the fifth voltage and the seventh voltage is greater than the predetermined pole bus direct current voltage measurement abnormal detection threshold, it indicates that a UDCH abnormal measurement occurs at the pole bus direct current voltage measurement point of the duty control system at the detection pole; and in a case that the smaller one of the fifth voltage and the seventh voltage is not greater than the predetermined pole bus direct current voltage measurement abnormal detection threshold, it indicates that no abnormal measurement occurs.

In step 207, in a case of meeting a first hysteresis condition of the hysteresis comparison, an abnormal pole bus direct current voltage measurement flag bit is generated for the duty control system at the detection pole after a first predetermined delay.

It should be noted that the abnormal pole bus direct current voltage measurement flag bit for the duty control system at the detection pole indicates that a UDCH abnormal measurement occurs at the pole bus direct current voltage measurement point of the duty control system at the detection pole.

In step 208, in a case of not meeting the first hysteresis condition of the hysteresis comparison, the abnormal pole bus direct current voltage measurement flag bit for the duty control system at the detection pole is cleared after a second predetermined delay.

In step 209, in the case that the modular multilevel converter high voltage direct current transmission system with the symmetrical bipolar structure is set with the direct current line side direct current voltage measurement point, a modular multilevel converter high voltage direct current voltage control is performed based on the direct current line side direct current voltage measurement point of the duty control system at the detection pole instead of the pole bus direct current voltage measurement point of the duty control system at the detection pole; and in the case that the modular multilevel converter high voltage direct current transmission system with the symmetrical bipolar structure is not set with the direct current line side direct current voltage measurement point, a modular multilevel converter high voltage direct current voltage control is performed based on the pole bus direct current voltage measurement point of the standby control system at the detection pole instead of the pole bus direct current voltage measurement point of the duty control system at the detection pole.

Figure 3:
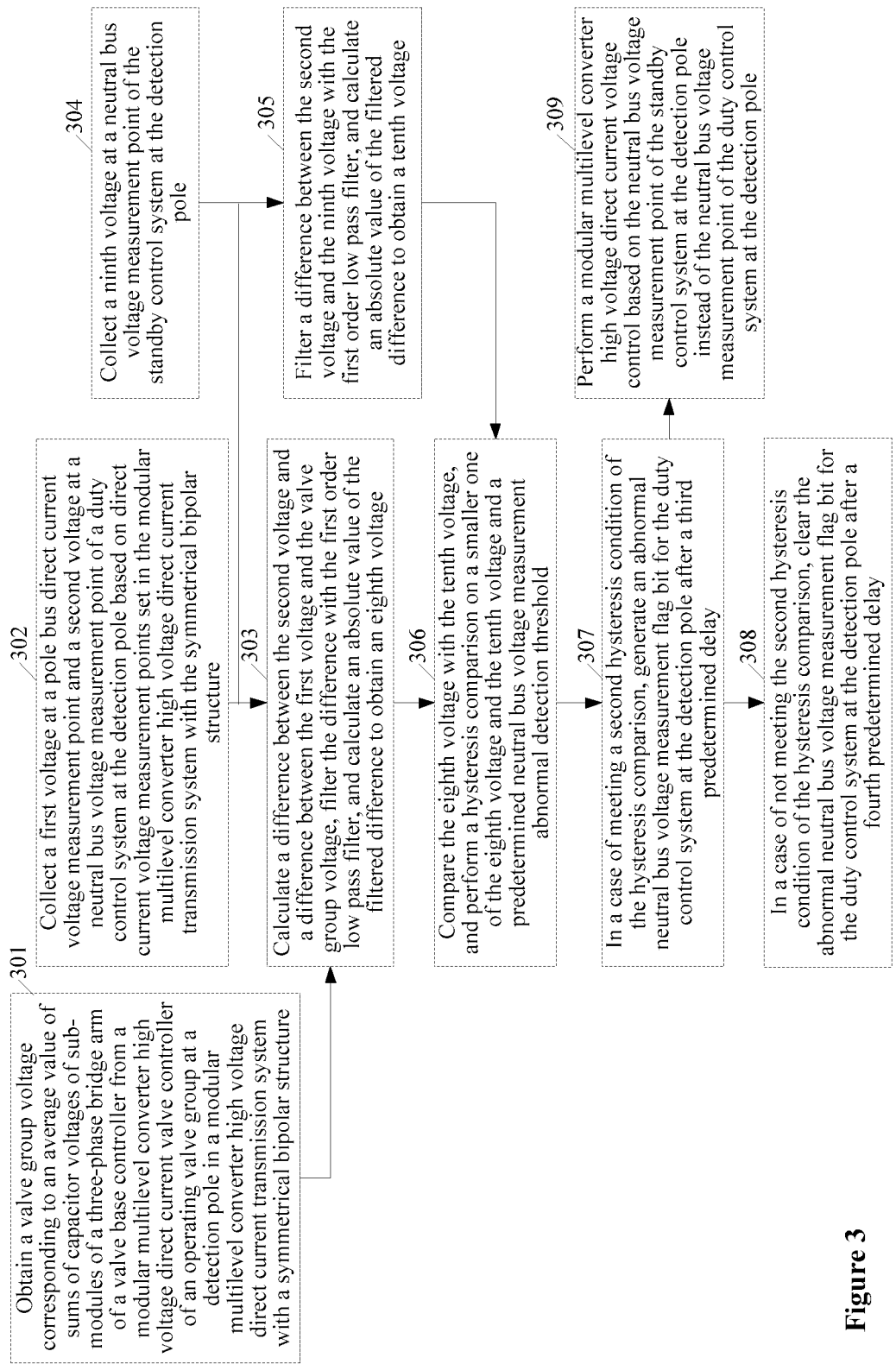
FIG. 3 is a flowchart of a method for detecting abnormal direct current voltage measurement in a modular multilevel converter high voltage direct current transmission system according to a second embodiment of the present disclosure.

Reference is made to FIG. 3, which is a flowchart of a method for detecting abnormal direct current voltage measurement in a modular multilevel converter high voltage direct current transmission system according to a second embodiment of the present disclosure. As shown in FIG. 3, the method includes the following steps 301 to 309.

In step 301, a valve group voltage corresponding to an average value of sums of capacitor voltages of sub-modules of a three-phase bridge arm of a modular multilevel converter high voltage direct current converter valve from a valve base controller of an operating valve group at a detection pole in a modular multilevel converter high voltage direct current transmission system with a symmetrical bipolar structure is obtained.

It should be noted that in the modular multilevel converter high voltage direct current transmission system with the symmetrical bipolar structure, in a case that a voltage at a detection pole (pole 1) is positive, the valve group voltage UC_C is an average value of sums of capacitor voltages of sub-modules of a three-phase bridge arm of a modular multilevel converter high voltage direct current converter valve transmitted by a valve base controller of a current valve group; and in a case that a voltage at a detection pole (pole 2) is negative, the valve group voltage UC_C is a negative value of an average value of sums of capacitor voltages of sub-modules of a three-phase bridge arm of a modular multilevel converter high voltage direct current converter valve transmitted by a valve base controller of a current valve group.

Firstly, the capacitor voltages of the sub-modules of the three-phase bridge arm of the modular multilevel converter high voltage direct current converter valve transmitted by the valve base controller of the valve group in operating at the detection pole are collected, then the sum of the capacitor voltages of the sub-modules of the three-phase bridge arm is calculated, and finally the average value of the sums corresponding to the three phases is calculated to obtain the valve group voltage UC_C.

In step 302, a first voltage at a pole bus direct current voltage measurement point and a second voltage at a neutral bus voltage measurement point of a duty control system at the detection pole are collected based on direct current voltage measurement points set in the modular multilevel converter high voltage direct current transmission system with the symmetrical bipolar structure.

It should be noted that based on the direct current voltage measurement points set in the modular multilevel converter high voltage direct current transmission system with the symmetrical bipolar structure, a first voltage UDCH at the pole bus direct current voltage measurement point and a second voltage UDN at the neutral bus voltage measurement point of the duty control system at the detection pole are collected.

In step 303, a difference between the second voltage and a difference between the first voltage and the valve group voltage is calculated, the difference is filtered by using the first order low pass filter, and an absolute value of the filtered difference is calculated to obtain an eighth voltage.

In step 304, a ninth voltage at a neutral bus voltage measurement point of the standby control system at the detection pole is collected.

In step 305, a difference between the second voltage and the ninth voltage is filtered by using the first-order low-pass filter, and an absolute value of the filtered difference is calculated to obtain a tenth voltage.

In step 306, the eighth voltage is compared with the tenth voltage, and a hysteresis comparison is performed on a smaller one of the eighth voltage and the tenth voltage and a predetermined neutral bus voltage measurement abnormal detection threshold.

It should be noted that the eighth voltage is compared with the tenth voltage, and the hysteresis comparison is performed on the smaller one of the eighth voltage and the tenth voltage and the predetermined neutral bus direct current voltage measurement abnormal detection threshold. In a case that the smaller one of the eighth voltage and the tenth voltage is greater than the predetermined neutral bus direct current voltage measurement abnormal detection threshold, it indicates that a UDN abnormal measurement occurs at the neutral bus direct current voltage measurement point of the duty control system at the detection pole; and in a case that the smaller one of the eighth voltage and the tenth voltage is not greater than the predetermined neutral bus direct current voltage measurement abnormal detection threshold, it indicates that no abnormal measurement occurs.

In step 307, in a case of meeting a second hysteresis condition of the hysteresis comparison, an abnormal neutral bus voltage measurement flag bit for the duty control system at the detection pole is generated after a third predetermined delay.

In step 308, in a case of not meeting the second hysteresis condition of the hysteresis comparison, the abnormal neutral bus voltage measurement flag bit for the duty control system at the detection pole is cleared after a fourth predetermined delay.

In step 309, a modular multilevel converter high voltage direct current voltage control is performed based on the neutral bus voltage measurement point of the standby control system at the detection pole instead of the neutral bus voltage measurement point of the duty control system at the detection pole.

Figure 4:
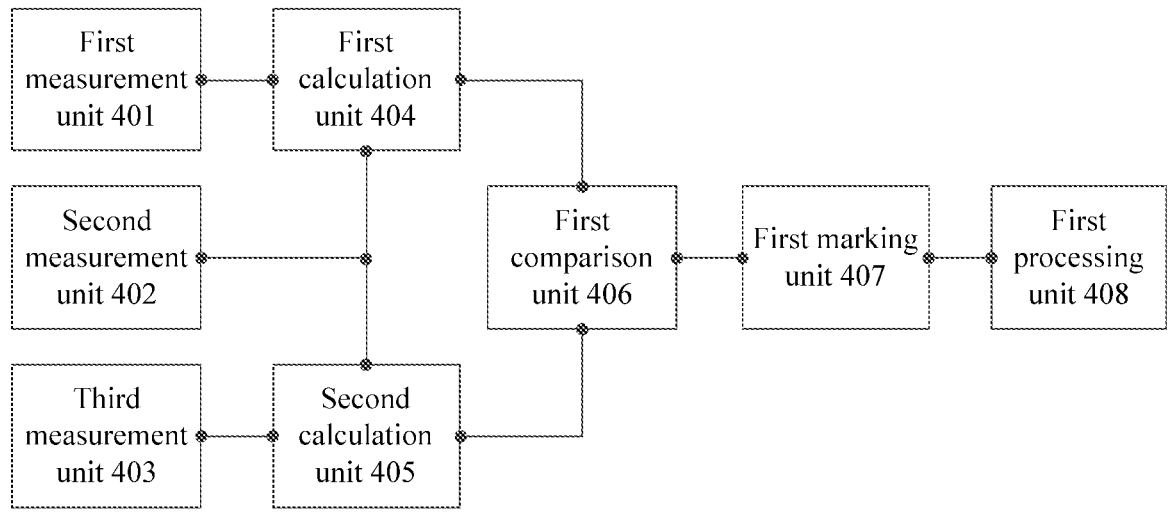
FIG. 4 is a schematic structural diagram of an apparatus for detecting abnormal direct current voltage measurement in a modular multilevel converter high voltage direct current transmission system according to a first embodiment of the present disclosure.

Reference is made to FIG. 4, which is a schematic structural diagram of an apparatus for detecting abnormal direct current voltage measurement in a modular multilevel converter high voltage direct current transmission system according to a first embodiment of the present disclosure. As shown in FIG. 4, the apparatus includes a first measurement unit 401, a second measurement unit 402, a third measurement unit 403, a first calculation unit 404, a second calculation unit 405, a first comparison unit 406, a first marking unit 407 and a first processing unit 408.

The first measurement unit 401 is configured to obtain a valve group voltage corresponding to an average value of sums of capacitor voltages of sub-modules of a three-phase bridge arm of a modular multilevel converter high voltage direct current converter valve from a valve base controller of an operating valve group at a detection pole in a modular multilevel converter high voltage direct current transmission system with a symmetrical bipolar structure.

The second measurement unit 402 is configured to collect a first voltage at a pole bus direct current voltage measurement point and a second voltage at a neutral bus voltage measurement point of a duty control system at the detection pole based on direct current voltage measurement points set in the modular multilevel converter high voltage direct current transmission system with the symmetrical bipolar structure.

The third measurement unit 403 is configured to collect a third voltage at a direct current line side direct current voltage measurement point in a case that the modular multilevel converter high voltage direct current transmission system with the symmetrical bipolar structure is set with the direct current line side direct current voltage measurement point, and collect a fourth voltage at a pole bus direct current voltage measurement point of a standby control system at the detection pole in a case that the modular multilevel converter high voltage direct current transmission system with the symmetrical bipolar structure is not set with a direct current line side direct current voltage measurement point.

The first calculation unit 404 is configured to calculate a difference between the first voltage and a sum of the second voltage and the valve group voltage, and filter the difference with a first order low pass filter and calculate an absolute value of the filtered difference to obtain a fifth voltage.

The second calculation unit 405 is configured to filter a difference between the first voltage and the third voltage with the first order low pass filter and calculate an absolute value of the filtered difference to obtain a sixth voltage in a case that the modular multilevel converter high voltage direct current transmission system with the symmetrical bipolar structure is set with the direct current line side direct current voltage measurement point, and filter a difference between the first voltage and the fourth voltage with the first order low pass filter and calculate an absolute value of the filtered difference to obtain a seventh voltage in a case that the modular multilevel converter high voltage direct current transmission system with the symmetrical bipolar structure is not set with the direct current line side direct current voltage measurement point.

The first comparison unit 406 is configured to compare the fifth voltage with the sixth voltage or compare the fifth voltage with the seventh voltage, and perform a hysteresis comparison on a smaller one of the fifth voltage and the sixth voltage or a smaller one of the fifth voltage and the seventh voltage and a predetermined pole bus direct current voltage measurement abnormal detection threshold.

The first marking unit 407 is configured to, in a case of meeting a first hysteresis condition of the hysteresis comparison, generate an abnormal pole bus direct current voltage measurement flag bit for the duty control system at the detection pole after a first predetermined delay.

The first processing unit 408 is configured to: perform a modular multilevel converter high voltage direct current voltage control based on the direct current line side direct current voltage measurement point of the duty control system at the detection pole instead of the pole bus direct current voltage measurement point of the duty control system at the detection pole in a case that the modular multilevel converter high voltage direct current transmission system with the symmetrical bipolar structure is set with the direct current line side direct current voltage measurement point, and perform a modular multilevel converter high voltage direct current voltage control based on the pole bus direct current voltage measurement point of the standby control system at the detection pole instead of the pole bus direct current voltage measurement point of the duty control system at the detection pole in a case that the modular multilevel converter high voltage direct current transmission system with the symmetrical bipolar structure is not set with the direct current line side direct current voltage measurement point.

Figure 5:
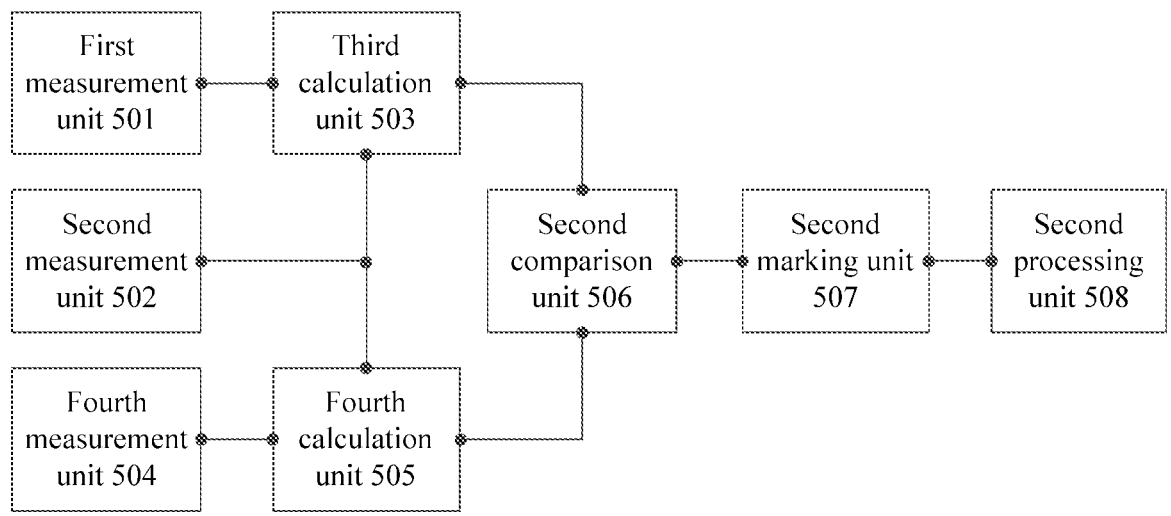
FIG. 5 is a schematic structural diagram of an apparatus for detecting abnormal direct current voltage measurement in a modular multilevel converter high voltage direct current transmission system according to a second embodiment of the present disclosure.

Reference is made to FIG. 5, which is a schematic structural diagram of an apparatus for detecting abnormal direct current voltage measurement in a modular multilevel converter high voltage direct current transmission system according to a second embodiment of the present disclosure. As shown in FIG. 5, the apparatus includes a first measurement unit 501, a second measurement unit 502, a third calculation unit 503, a fourth measurement unit 504, a fourth calculation unit 505, a second comparison unit 506, a second marking unit 507 and a second processing unit 508.

The first measurement unit 501 is configured to obtain a valve group voltage corresponding to an average value of sums of capacitor voltages of sub-modules of a three-phase bridge arm of a modular multilevel converter high voltage direct current converter valve from a valve base controller of an operating valve group at a detection pole in a modular multilevel converter high voltage direct current transmission system with a symmetrical bipolar structure.

The second measurement unit 502 is configured to collect a first voltage at a pole bus direct current voltage measurement point and a second voltage at a neutral bus voltage measurement point of a duty control system at the detection pole based on direct current voltage measurement points set in the modular multilevel converter high voltage direct current transmission system with the symmetrical bipolar structure.

The third calculation unit 503 is configured to calculate a difference between the second voltage and a difference between the first voltage and the valve group voltage, filter the difference with the first order low pass filter and calculate an absolute value of the filtered difference to obtain an eighth voltage.

The fourth measurement unit 504 is configured to collect a ninth voltage at a neutral bus voltage measurement point of a standby control system at the detection pole.

The fourth calculation unit 505 is configured to filter a difference between the second voltage and the ninth voltage with the first order low pass filter and calculate an absolute value of the filtered difference to obtain a tenth voltage.

The second comparison unit 506 is configured to compare the eighth voltage with the tenth voltage and perform a hysteresis comparison on a smaller one of the eighth voltage and the tenth voltage and a predetermined neutral bus voltage measurement abnormal detection threshold.

The second marking unit 507 is configured to, in a case of meeting a second hysteresis condition of the hysteresis comparison, generate an abnormal neutral bus voltage measurement flag bit for the duty control system at the detection pole after a third predetermined delay.

The second processing unit 508 is configured to perform a modular multilevel converter high voltage direct current voltage control based on the neutral bus voltage measurement point of the standby control system at the detection pole instead of the neutral bus voltage measurement point of the duty control system at the detection pole.

A method for detecting abnormal direct current voltage measurement in a modular multilevel converter high voltage direct current transmission system is provided according to the present disclosure. According to the method, a valve group voltage at a detection pole is obtained, voltages at voltage measurement points at the detection pole are collected, and comparison and determination are performed based on the actual arrangement of the voltage measurement points, and then whether an abnormal measurement occurs at each of the voltage measurement points is determined. Based on the actual structure of the modular multilevel converter high voltage direct current transmission system, the problem of abnormal measurement of the voltage measurement points is solved by performing measurement point replacement, thereby solving the technical problem that the locating method and the fast diagnosing method focusing on a conventional direct current voltage measurement abnormal fault according to the conventional technology cannot be applied to detecting a single abnormal measurement in the modular multilevel converter high voltage direct current transmission system.

In the specification and the accompanying drawings of the present disclosure, the terms "first", "second", "third", "fourth", and the like (if existing) are intended to distinguish between similar objects rather than describe a specific sequence or a precedence order. Data used in this way is interchangeable in a suitable case, so that the embodiments of the present disclosure described herein can be implemented in a sequence in addition to the sequence shown or described herein. Moreover, the terms "include", "contain", and any other variants thereof mean to cover the non-exclusive inclusion. For example, a process, method, system, product, or device that includes a list of steps or units is not necessarily limited to those steps or units that are clearly listed, but may include other steps or units not expressly listed or inherent to such a process, method, product, or device.

It should be understood that in the present disclosure, the term "at least one" refers to a quantity equal to one or more, and the term "multiple" refers to a quantity equal to two or more. The term "and/or" are used to describe an association relationship between objects, and indicates three possible relationships. For example, "A and/or B" may indicate a case in which only A exists, a case in which only B exists, or a case in which both A and B exist. In the above cases, each of A and B may be may be singular or plural. The symbol "/" generally indicates that associated objects have an "or" relationship. The expression of "at least one of" or a similar expression refers to any combination of items, including any combination of single items or plural items. For example, at least one of a, b, or c may indicate: a, b, c, "a and b", "a and c", "b and c", or "a, b, and c", where each of a, b, and c may be singular or plural.

It should be understood that the system, apparatus, and method according to the embodiments of the present disclosure may be implemented in other manners. For example, the apparatus embodiments described above are only schematic. For example, the division of the units is only a division according to logical functions, and there may be other division manners in practical implementations. For example, multiple units or components may be combined or may be integrated into another system, or some features may be omitted or may be not implemented. In addition, the mutual coupling or direct coupling or communication connection shown or discussed above may be indirect coupling or communication connection via some interfaces, devices or units, and may be electrical, mechanical or in other forms.

The units described as separate components may be or may not be separated physically, and the components displayed as units may be or may not be physical units, that is, the components may be located at a same position, or may be distributed to multiple network units. Some or all of the units may be selected according to actual requirements to achieve the purpose of the solutions of the embodiments.

In addition, functional units in the embodiments of the present disclosure may be integrated in one processing unit, or each unit may be physically independent, or two or more units may be integrated in one unit. The integrated unit may be implemented in a form of hardware, or in a form of a software function unit.

In a case that the integrated unit is implemented in the form of software function unit and is sold or used as a separate product, it can also be stored in a computer readable storage medium. Based on such an understanding, the technical solutions of the present disclosure essentially, or the part contributing to the conventional technology, or all or a part of the technical solutions may be implemented in the form of a software product. The computer software product is stored in a storage medium and includes several instructions for instructing a computer device (which may be a PC, a server or a network device) to perform all or some of the steps of the method described in the embodiments of the present disclosure. The foregoing storage medium includes various media that can store program codes, for example, a USB disk, a mobile hard disk, a read-only memory (ROM), a random access memory (RAM), a magnetic disk, an optical disk.

The foregoing embodiments are used for describing, instead of limiting the technical solutions of the present disclosure. Those skilled in the art shall understand that although the present disclosure has been described in detail with reference to the foregoing embodiments, modifications can be made to the technical solutions described in the foregoing embodiments, or equivalent replacements can be made to some technical features in the technical solutions, provided that such modifications or replacements do not cause the essence of corresponding technical solutions to depart from the spirit and scope of the technical solutions of the embodiments of the present disclosure.

The invention claimed is:

1. A method for detecting abnormal direct current voltage measurement in a modular multilevel converter high voltage direct current transmission system, comprising:

obtaining a valve group voltage corresponding to an average value of sums of capacitor voltages of sub-modules of a three-phase bridge arm of a modular multilevel converter high voltage direct current converter valve from a valve base controller of an operating valve group at a detection pole in a modular multilevel converter high voltage direct current transmission system with a symmetrical bipolar structure;

collecting a first voltage at a pole bus direct current voltage measurement point and a second voltage at a neutral bus voltage measurement point of a duty control system at the detection pole based on direct current voltage measurement points set in the modular multilevel converter high voltage direct current transmission system with the symmetrical bipolar structure;

in a case that the modular multilevel converter high voltage direct current transmission system with the symmetrical bipolar structure is set with a direct current line side direct current voltage measurement point, collecting a third voltage at the direct current line side direct current voltage measurement point; and in a case that the modular multilevel converter high voltage direct current transmission system with the symmetrical bipolar structure is not set with a direct current line side direct current voltage measurement point, collecting a fourth voltage at a pole bus direct current voltage measurement point of a standby control system at the detection pole;

calculating a difference between the first voltage and a sum of the second voltage and the valve group voltage, filtering the difference with a first order low pass filter and calculating an absolute value of the filtered difference to obtain a fifth voltage;

in the case that the modular multilevel converter high voltage direct current transmission system with the symmetrical bipolar structure is set with the direct current line side direct current voltage measurement point, filtering a difference between the first voltage and the third voltage with the first order low pass filter and calculating an absolute value of the filtered difference to obtain a sixth voltage; and in the case that the modular multilevel converter high voltage direct current transmission system with the symmetrical bipolar structure is not set with the direct current line side direct current voltage measurement point, filtering a difference between the first voltage and the fourth voltage with the first order low pass filter and calculating an absolute value of the filtered difference to obtain a seventh voltage;

comparing the fifth voltage with the sixth voltage or comparing the fifth voltage with the seventh voltage, and performing a hysteresis comparison on a smaller one of the fifth voltage and the sixth voltage or a smaller one of the fifth voltage and the seventh voltage and a predetermined pole bus direct current voltage measurement abnormal detection threshold; and in a case of meeting a first hysteresis condition of the hysteresis comparison, generating an abnormal pole bus direct current voltage measurement flag bit for the duty control system at the detection pole after a first predetermined delay.

2. The method for detecting abnormal direct current voltage measurement in a modular multilevel converter high voltage direct current transmission system according to claim 1, wherein after generating the abnormal pole bus direct current voltage measurement flag bit for the duty control system at the detection pole, the method further comprises:
  in a case of not meeting the first hysteresis condition of the hysteresis comparison, clearing the abnormal pole bus direct current voltage measurement flag bit for the duty control system at the detection pole after a second predetermined delay.

3. The method for detecting abnormal direct current voltage measurement in a modular multilevel converter high voltage direct current transmission system according to claim 1, wherein after collecting the first voltage at the pole bus direct current voltage measurement point and the second voltage at the neutral bus voltage measurement point of the duty control system at the detection pole, the method further comprises:
  calculating a difference between the second voltage and a difference between the first voltage and the valve group voltage, filtering the difference with the first order low pass filter and calculating an absolute value of the filtered difference to obtain an eighth voltage;
  collecting a ninth voltage at a neutral bus voltage measurement point of the standby control system at the detection pole;
  filtering a difference between the second voltage and the ninth voltage with the first order low pass filter and calculating an absolute value of the filtered difference to obtain a tenth voltage;
  comparing the eighth voltage with the tenth voltage, and performing a hysteresis comparison on a smaller one of the eighth voltage and the tenth voltage and a predetermined neutral bus voltage measurement abnormal detection threshold; and
  in a case of meeting a second hysteresis condition of the hysteresis comparison, generating an abnormal neutral bus voltage measurement flag bit for the duty control system at the detection pole after a third predetermined delay.

4. The method for detecting abnormal direct current voltage measurement in a modular multilevel converter high voltage direct current transmission system according to claim 3, wherein after generating the abnormal neutral bus voltage measurement flag bit for the duty control system at the detection pole, the method further comprises:
  in a case of not meeting the second hysteresis condition of the hysteresis comparison, clearing the abnormal neutral bus voltage measurement flag bit for the duty control system at the detection pole after a fourth predetermined delay.

5. The method for detecting abnormal direct current voltage measurement in a modular multilevel converter high voltage direct current transmission system according to claim 1, wherein after generating the abnormal pole bus direct current voltage measurement flag bit for the duty control system at the detection pole, the method further comprises:
  in the case that the modular multilevel converter high voltage direct current transmission system with the symmetrical bipolar structure is set with the direct current line side direct current voltage measurement point, performing a modular multilevel converter high voltage direct current voltage control based on the direct current line side direct current voltage measurement point of the duty control system at the detection pole instead of the pole bus direct current voltage measurement point of the duty control system at the detection pole; and
  in the case that the modular multilevel converter high voltage direct current transmission system with the symmetrical bipolar structure is not set with the direct current line side direct current voltage measurement point, performing a modular multilevel converter high voltage direct current voltage control based on the pole bus direct current voltage measurement point of the standby control system at the detection pole instead of the pole bus direct current voltage measurement point of the duty control system at the detection pole.

6. The method for detecting abnormal direct current voltage measurement in a modular multilevel converter high voltage direct current transmission system according to claim 3, wherein after generating the abnormal neutral bus voltage measurement flag bit for the duty control system at the detection pole, the method further comprises:
  performing a modular multilevel converter high voltage direct current voltage control based on the neutral bus voltage measurement point of the standby control system at the detection pole instead of the neutral bus voltage measurement point of the duty control system at the detection pole.

7. An apparatus for detecting abnormal direct current voltage measurement in a modular multilevel converter high voltage direct current transmission system, comprising:
  a first measurement unit, configured to obtain a valve group voltage corresponding to an average value of sums of capacitor voltages of sub-modules of a three-phase bridge arm of a modular multilevel converter high voltage direct current converter valve from a valve base controller of an operating valve group at a detection pole in a modular multilevel converter high voltage direct current transmission system with a symmetrical bipolar structure;
  a second measurement unit, configured to collect a first voltage at a pole bus direct current voltage measurement point and a second voltage at a neutral bus voltage measurement point of a duty control system at the detection pole based on direct current voltage measurement points set in the modular multilevel converter high voltage direct current transmission system with the symmetrical bipolar structure;
  a third measurement unit, configured to collect a third voltage at a direct current line side direct current voltage measurement point in a case that the modular multilevel converter high voltage direct current transmission system with the symmetrical bipolar structure is set with the direct current line side direct current voltage measurement point, and collect a fourth voltage at a pole bus direct current voltage measurement point of a standby control system at the detection pole in a case that the modular multilevel converter high voltage direct current transmission system with the symmetrical bipolar structure is not set with a direct current line side direct current voltage measurement point;
  a first calculation unit, configured to calculate a difference between the first voltage and a sum of the second voltage and the valve group voltage, and filter the difference with a first order low pass filter and calculate an absolute value of the filtered difference to obtain a fifth voltage;

a second calculation unit, configured to filter a difference between the first voltage and the third voltage with the first order low pass filter and calculate an absolute value of the filtered difference to obtain a sixth voltage in a case that the modular multilevel converter high voltage direct current transmission system with the symmetrical bipolar structure is set with the direct current line side direct current voltage measurement point, and filter a difference between the first voltage and the fourth voltage with the first order low pass filter and calculate an absolute value of the filtered difference to obtain a seventh voltage in a case that the modular multilevel converter high voltage direct current transmission system with the symmetrical bipolar structure is not set with the direct current line side direct current voltage measurement point;

a first comparison unit, configured to compare the fifth voltage with the sixth voltage or compare the fifth voltage with the seventh voltage, and perform a hysteresis comparison on a smaller one of the fifth voltage and the sixth voltage or a smaller one of the fifth voltage and the seventh voltage and a predetermined pole bus direct current voltage measurement abnormal detection threshold; and a first marking unit, configured to, in a case of meeting a first hysteresis condition of the hysteresis comparison, generate an abnormal pole bus direct current voltage measurement flag bit for the duty control system at the detection pole after a first predetermined delay.

8. The apparatus for detecting abnormal direct current voltage measurement in a modular multilevel converter high voltage direct current transmission system according to claim 7, further comprising:

a third calculation unit, configured to calculate a difference between the second voltage and a difference between the first voltage and the valve group voltage, filter the difference with the first order low pass filter and calculate an absolute value of the filtered difference to obtain an eighth voltage;

a fourth measurement unit, configured to collect a ninth voltage at a neutral bus voltage measurement point of the standby control system at the detection pole;

a fourth calculation unit, configured to filter a difference between the second voltage and the ninth voltage with the first order low pass filter and calculate an absolute value of the filtered difference to obtain a tenth voltage;

a second comparison unit, configured to compare the eighth voltage with the tenth voltage and perform a hysteresis comparison on a smaller one of the eighth voltage and the tenth voltage and a predetermined neutral bus voltage measurement abnormal detection threshold; and a second marking unit, configured to, in a case of meeting a second hysteresis condition of the hysteresis comparison, generate an abnormal neutral bus voltage measurement flag bit for the duty control system at the detection pole after a third predetermined delay.

9. The apparatus for detecting abnormal direct current voltage measurement in a modular multilevel converter high voltage direct current transmission system according to claim 7, further comprising:

a first processing unit, configured to: perform a modular multilevel converter high voltage direct current voltage control based on the direct current line side direct current voltage measurement point of the duty control system at the detection pole instead of the pole bus direct current voltage measurement point of the duty control system at the detection pole in a case that the modular multilevel converter high voltage direct current transmission system with the symmetrical bipolar structure is set with the direct current line side direct current voltage measurement point, and perform a modular multilevel converter high voltage direct current voltage control based on the pole bus direct current voltage measurement point of the standby control system at the detection pole instead of the pole bus direct current voltage measurement point of the duty control system at the detection pole in a case that the modular multilevel converter high voltage direct current transmission system with the symmetrical bipolar structure is not set with the direct current line side direct current voltage measurement point.

10. The apparatus for detecting abnormal direct current voltage measurement in a modular multilevel converter high voltage direct current transmission system according to claim 8, further comprising:

a second processing unit, configured to perform a modular multilevel converter high voltage direct current voltage control based on the neutral bus voltage measurement point of the standby control system at the detection pole instead of the neutral bus voltage measurement point of the duty control system at the detection pole.

* * * * *